(12) United States Patent
Stahr et al.

(10) Patent No.: US 10,426,040 B2
(45) Date of Patent: Sep. 24, 2019

(54) METHOD FOR PRODUCING A CIRCUIT BOARD ELEMENT

(71) Applicant: AT & S AUSTRIA TECHNOLOGIE & SYSTEMTECHNIK AKTIENGESELLSCHAFT, Leoben-Hinterberg (AT)

(72) Inventors: Johannes Stahr, St. Lorenzen (AT); Andreas Zluc, Leoben (AT)

(73) Assignee: AT & S AUSTRIA TECHNOLOGIE & SYSTEMTECHNIK AKTIENGESELLSCHAFT, Hinterberg (AT)

( * ) Notice: Subject to any disclaimer, the term of this patent is extended or adjusted under 35 U.S.C. 154(b) by 883 days.

(21) Appl. No.: 14/781,724

(22) PCT Filed: Mar. 17, 2014

(86) PCT No.: PCT/AT2014/050066
§ 371 (c)(1),
(2) Date: Oct. 1, 2015

(87) PCT Pub. No.: WO2014/161020
PCT Pub. Date: Oct. 9, 2014

(65) Prior Publication Data
US 2016/0044794 A1    Feb. 11, 2016

(30) Foreign Application Priority Data

Apr. 2, 2013    (AT) .................................. 50222/2013

(51) Int. Cl.
*H05K 3/30*    (2006.01)
*H05K 1/18*    (2006.01)
(Continued)

(52) U.S. Cl.
CPC ............. *H05K 3/30* (2013.01); *H01L 21/568* (2013.01); *H01L 23/5389* (2013.01);
(Continued)

(58) Field of Classification Search
CPC ....... H01L 24/96; H01L 24/97; H01L 21/568; H01L 23/5389; H05K 3/30; H05K 3/12;
(Continued)

(56) References Cited

U.S. PATENT DOCUMENTS 5,870,289 A    2/1999    Tokuda et al.
2003/0102572 A1    6/2003    Nathan et al.
(Continued)

FOREIGN PATENT DOCUMENTS

CN    102656954 A    9/2012
CN    102845140 A    12/2012
(Continued)

OTHER PUBLICATIONS

Non-English Chinese Office Action with English translation dated Aug. 15, 2017 for Chinese Application No. 201480024834.4.
(Continued)

*Primary Examiner* — Livius R. Cazan
(74) *Attorney, Agent, or Firm* — Ladas & Parry LLP

(57) ABSTRACT

The invention relates to a method for producing a circuit board element having at least one electronic component, which component has a connection side defined by electrical contacts or a conductive layer and is connected to a temporary carrier for positioning and embedded in an insulating material; the component is attached in a specified position directly to a plastic film as a temporary carrier, whereupon a composite layer having at least a carrier and an electrical conductor, preferably also having an insulating material, is attached on the side of the component opposite the plastic film, with the carrier facing away from the component, and
(Continued)

thereafter the plastic film is removed; then the component is embedded in insulating material. After the embedding of the component in the insulating material, an additional composite layer is preferably attached to the component and the embedding of the component on the side opposite the first composite layer.

21 Claims, 12 Drawing Sheets

(51) Int. Cl.
    *H01L 23/538* (2006.01)
    *H01L 23/00* (2006.01)
    *H01L 21/56* (2006.01)
    *H05K 3/00* (2006.01)
    *H05K 3/12* (2006.01)
    *H05K 3/46* (2006.01)

(52) U.S. Cl.
    CPC ............. *H01L 24/19* (2013.01); *H01L 24/24* (2013.01); *H01L 24/73* (2013.01); *H01L 24/82* (2013.01); *H01L 24/92* (2013.01); *H05K 1/185* (2013.01); *H05K 1/186* (2013.01); *H05K 3/007* (2013.01); *H05K 3/0064* (2013.01); *H05K 3/12* (2013.01); *H05K 3/4644* (2013.01); *H05K 3/4697* (2013.01); *H01L 24/27* (2013.01); *H01L 24/29* (2013.01); *H01L 24/32* (2013.01); *H01L 24/83* (2013.01); *H01L 2224/04105* (2013.01); *H01L 2224/2402* (2013.01); *H01L 2224/24137* (2013.01); *H01L 2224/2732* (2013.01); *H01L 2224/27334* (2013.01); *H01L 2224/27436* (2013.01); *H01L 2224/27505* (2013.01); *H01L 2224/2929* (2013.01); *H01L 2224/29339* (2013.01); *H01L 2224/32245* (2013.01); *H01L 2224/73104* (2013.01); *H01L 2224/73267* (2013.01); *H01L 2224/82007* (2013.01); *H01L 2224/82138* (2013.01); *H01L 2224/83191* (2013.01); *H01L 2224/83192* (2013.01); *H01L 2224/9222* (2013.01); *H01L 2224/92244* (2013.01); *H01L 2924/1305* (2013.01); *H01L 2924/13055* (2013.01); *H01L 2924/3511* (2013.01)

(58) Field of Classification Search
    CPC .. H05K 3/4644; H05K 3/4697; H05K 3/0064; H05K 3/007; H05K 1/185; H05K 1/186
    See application file for complete search history.

(56) References Cited

U.S. PATENT DOCUMENTS

| | | |
|---|---|---|
| 2003/0104654 A1 | 6/2003 | Farnworth |
| 2005/0285244 A1 | 12/2005 | Chen |
| 2007/0029666 A1* | 2/2007 | Goh ................. H01L 21/56 257/723 |
| 2010/0029047 A1 | 2/2010 | Hsu et al. |
| 2011/0045634 A1* | 2/2011 | Pagaila ............. H01L 24/19 438/107 |
| 2011/0127076 A1 | 6/2011 | Kim et al. |
| 2012/0235309 A1* | 9/2012 | Essig ................ H01L 23/488 257/782 |

FOREIGN PATENT DOCUMENTS

| | | |
|---|---|---|
| DE | 10 2009 029 201 A1 | 3/2011 |
| EP | 0 647 090 A1 | 4/1995 |
| JP | 2005-347547 A | 12/2005 |
| WO | 2003/065778 A1 | 8/2003 |
| WO | 2003/065779 A1 | 8/2003 |
| WO | 2004/077902 A | 9/2004 |
| WO | 2010/048654 A1 | 5/2010 |
| WO | 2012/100274 A1 | 8/2012 |

OTHER PUBLICATIONS

Espacenet English abstract of CN 102656954 A.
Espacenet English abstract of CN 102845140 A.
Espacenet English abstract of JP 2005-347547 A.
2010/048654 A1 English Abstract.
2012/100274 A1 English Abstract.

* cited by examiner

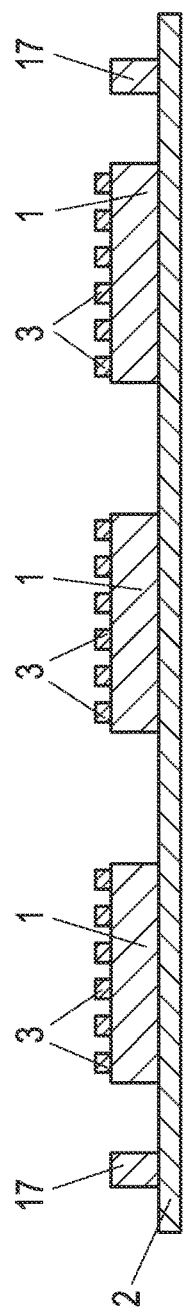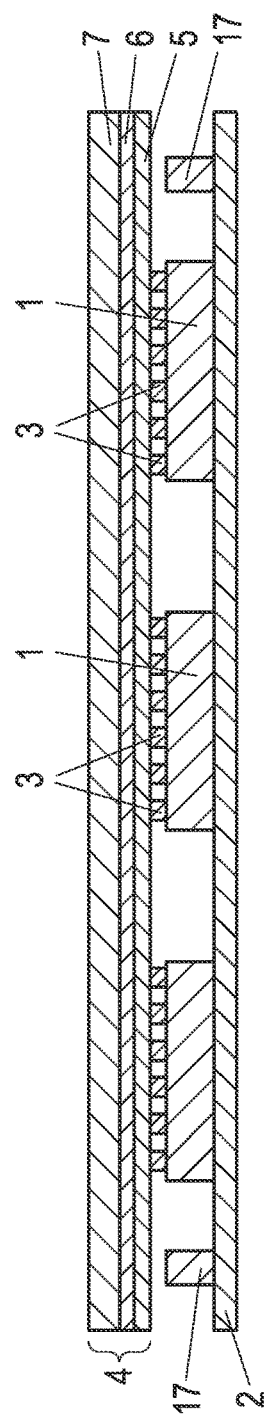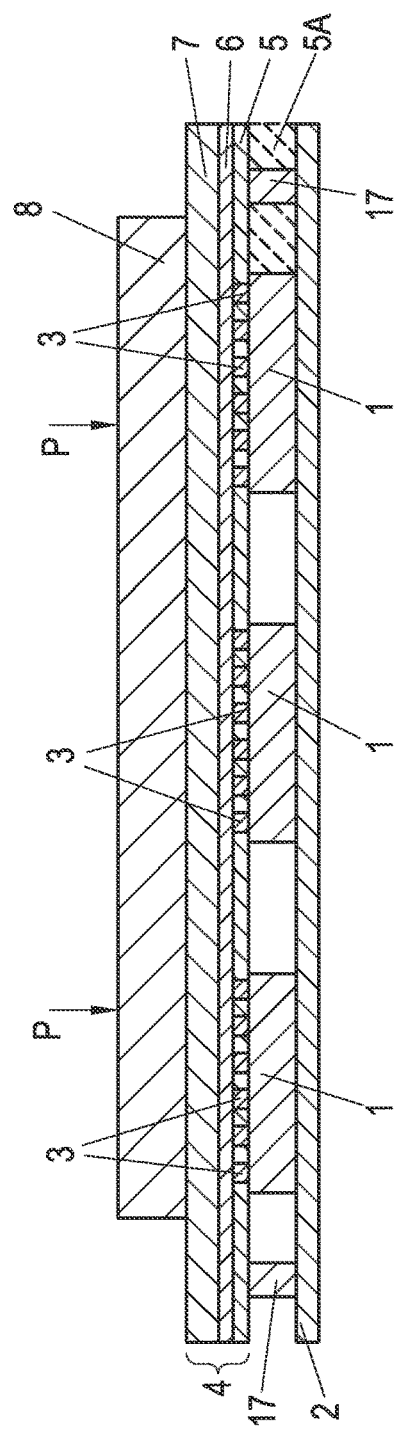

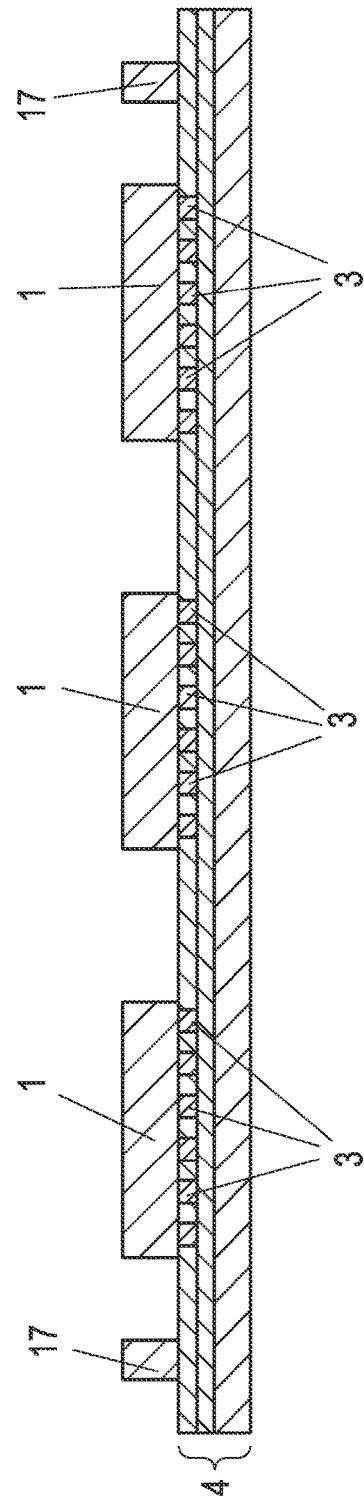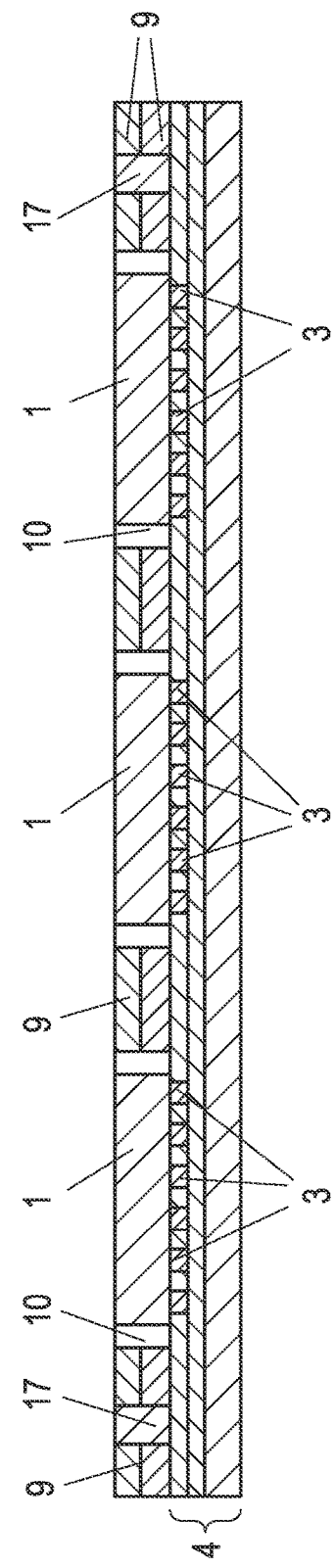

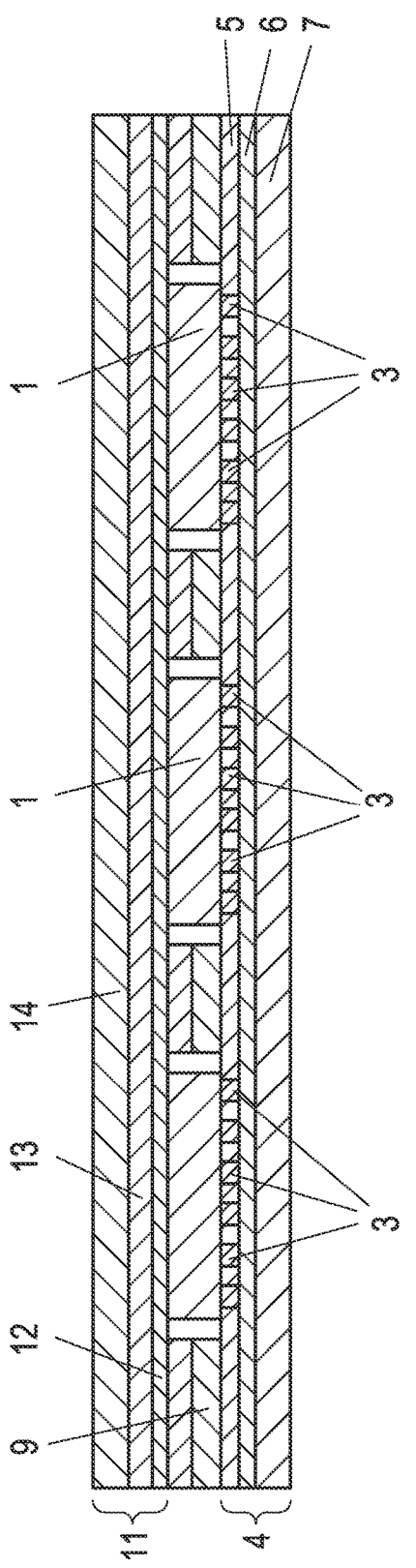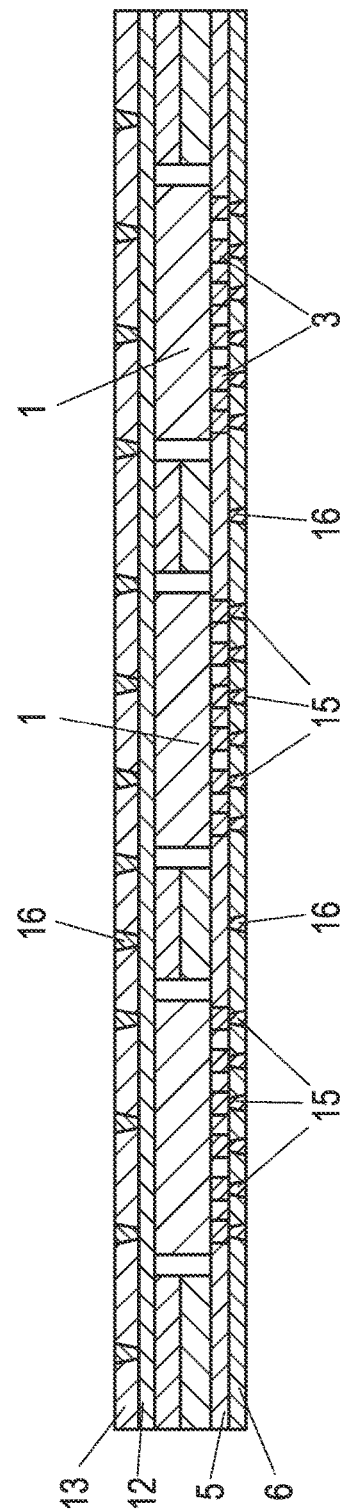

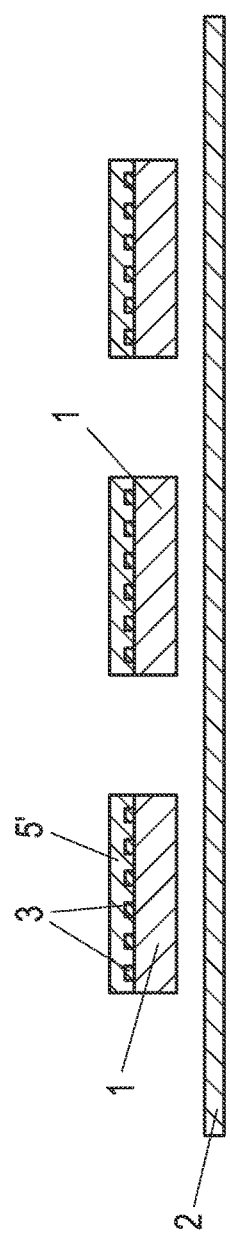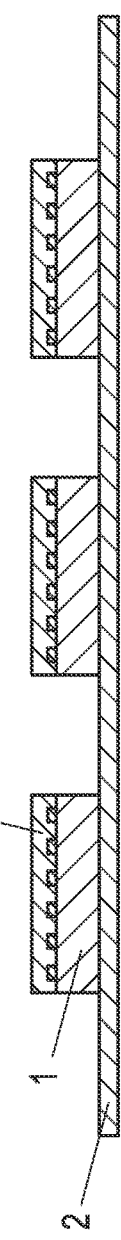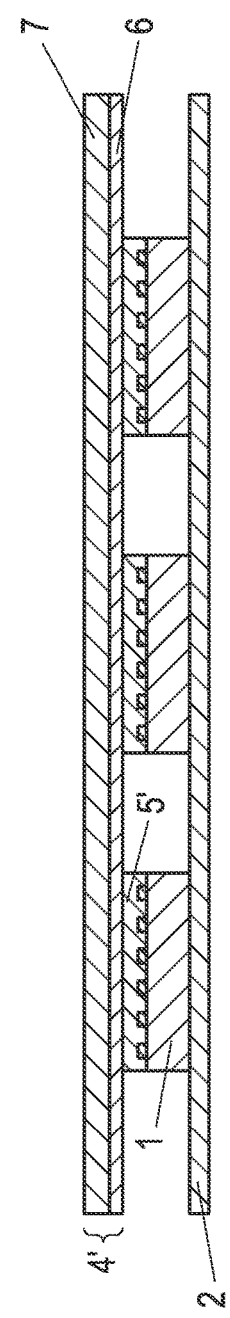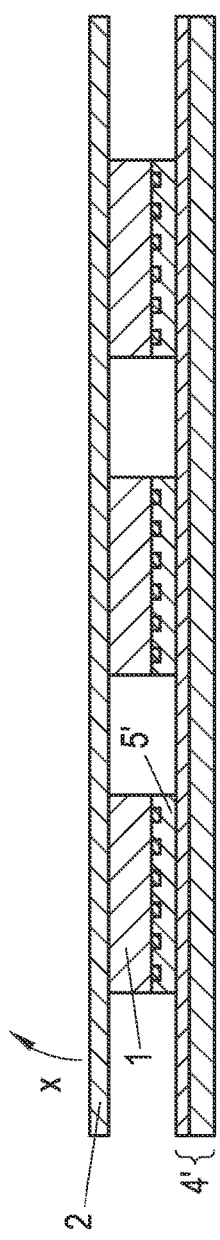
Fig. 2

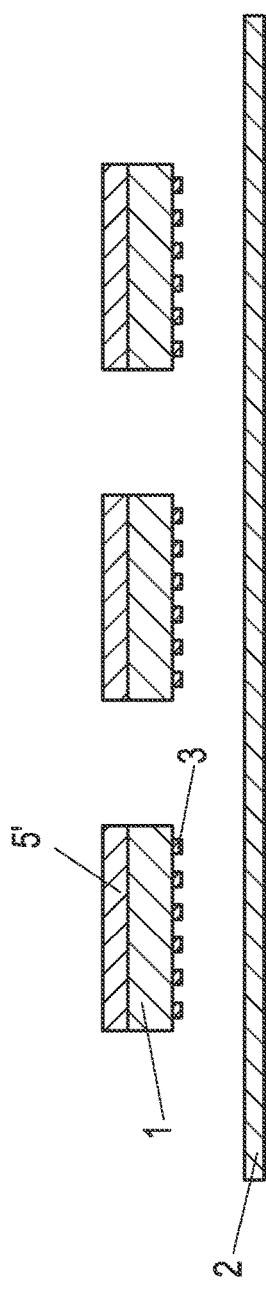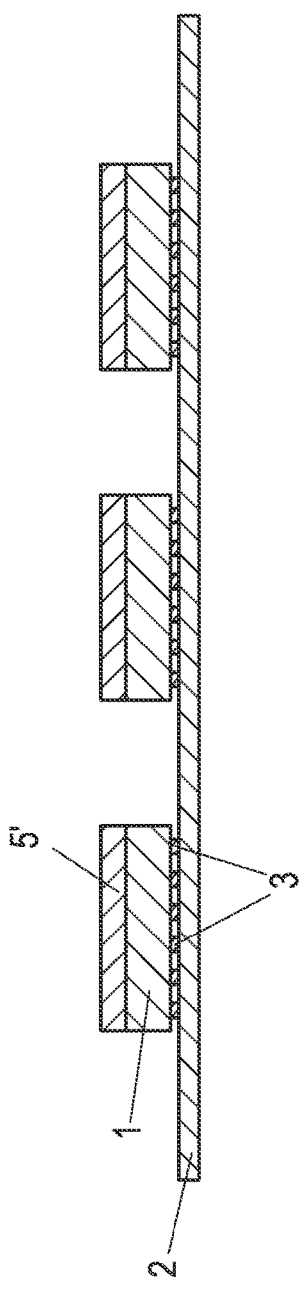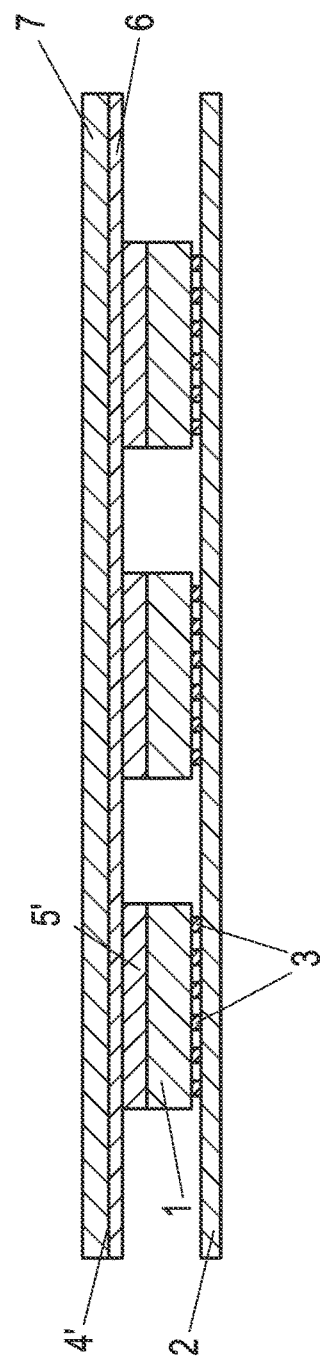

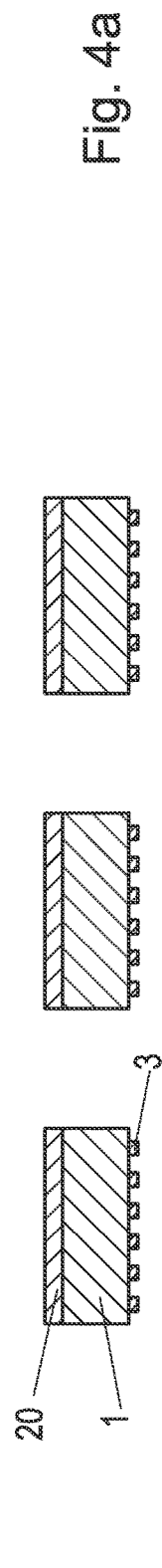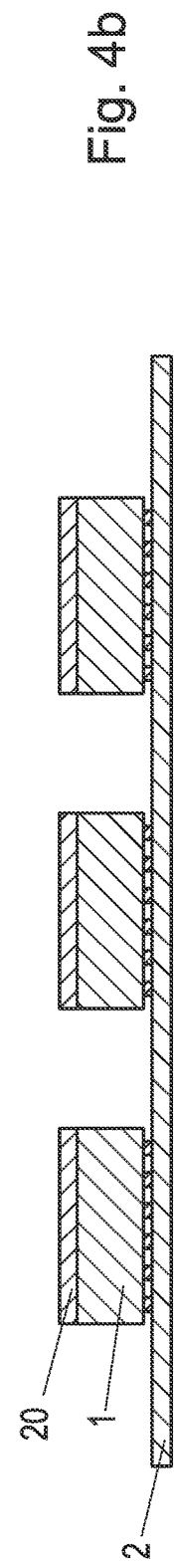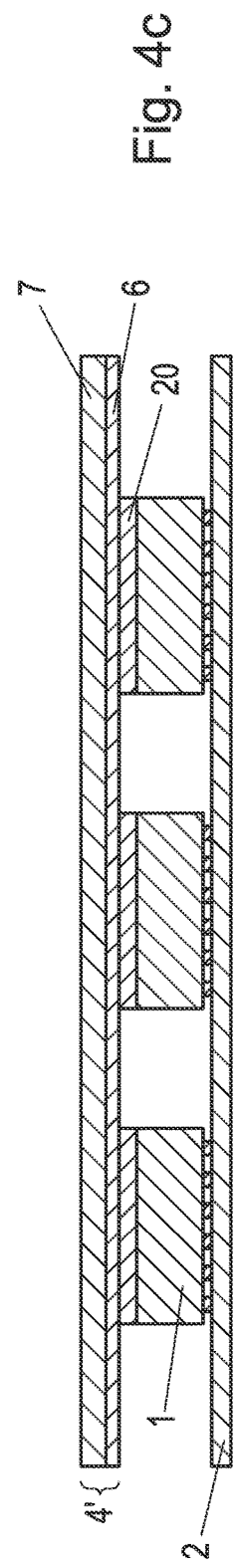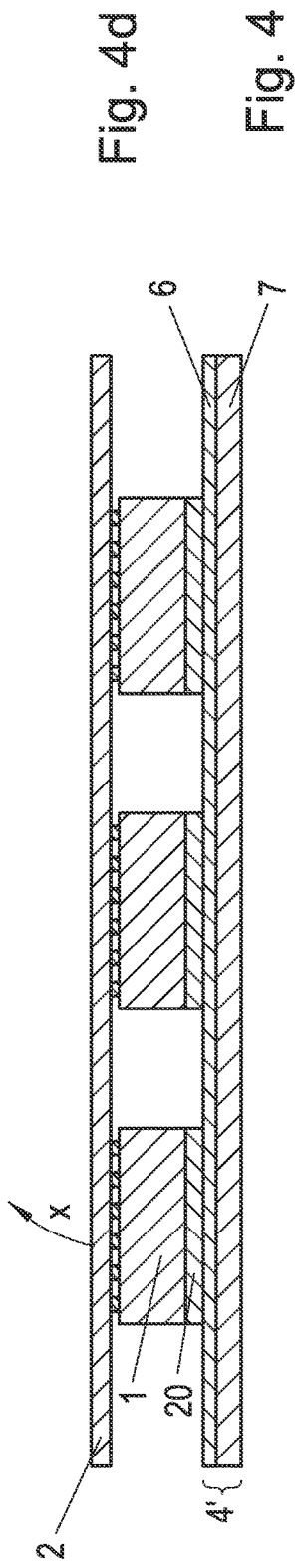

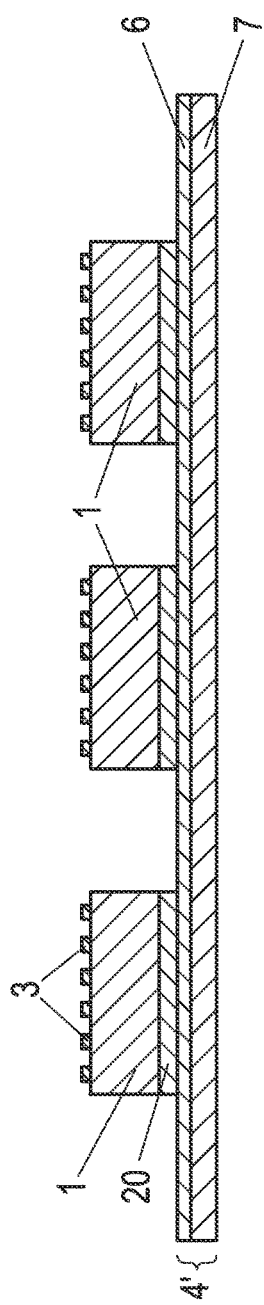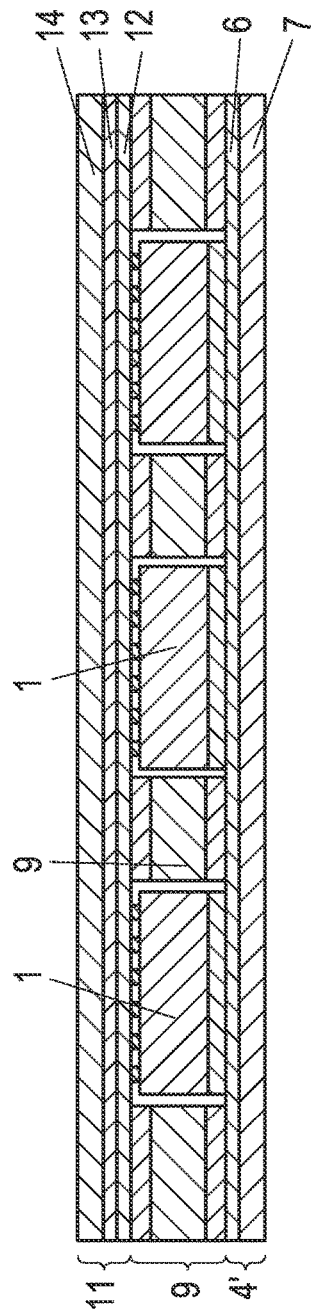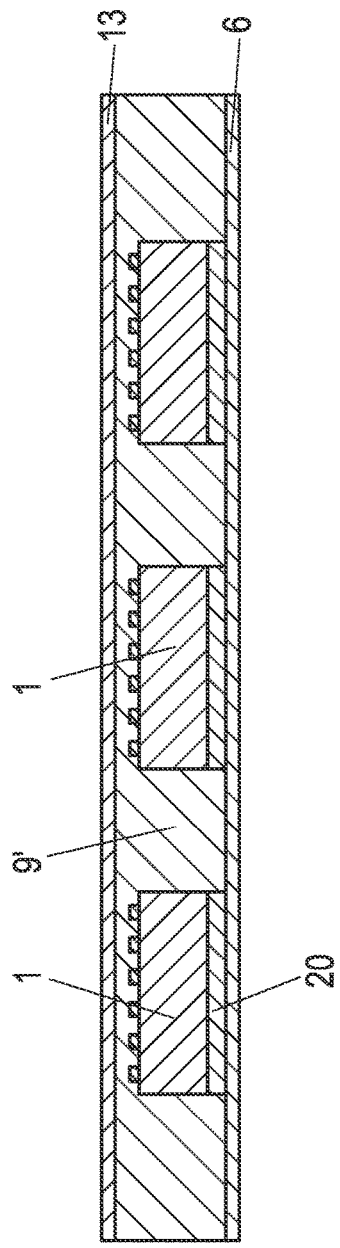

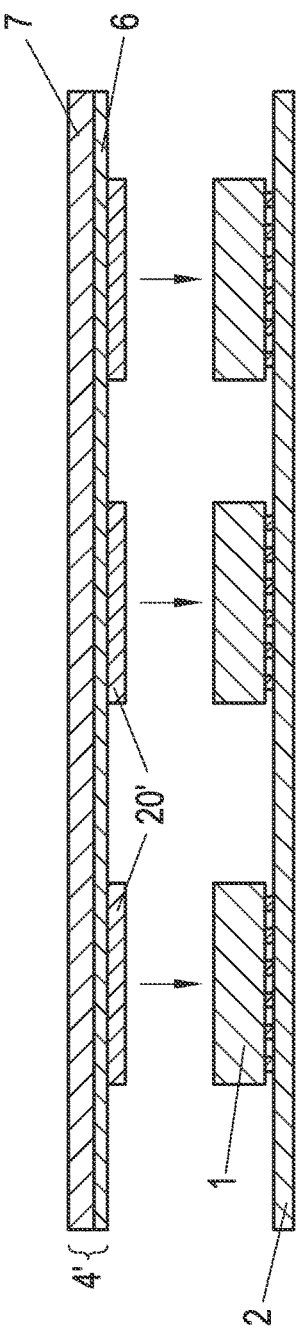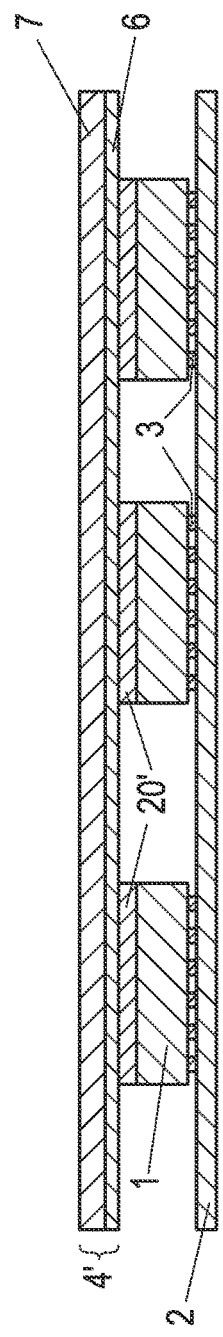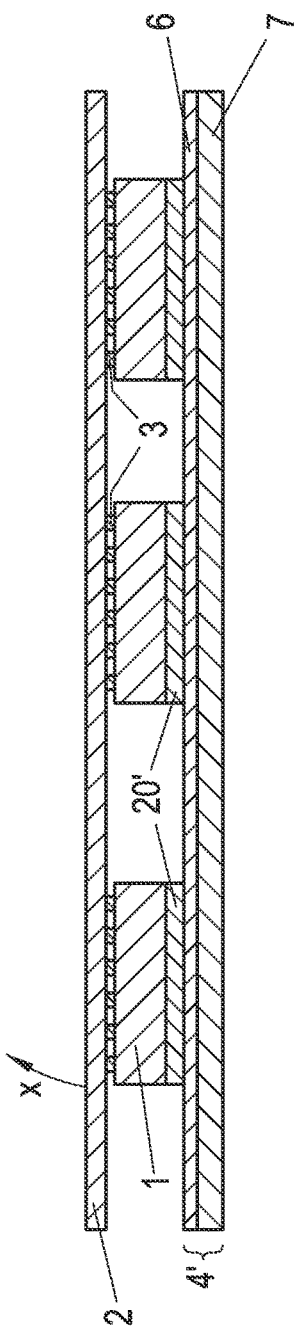

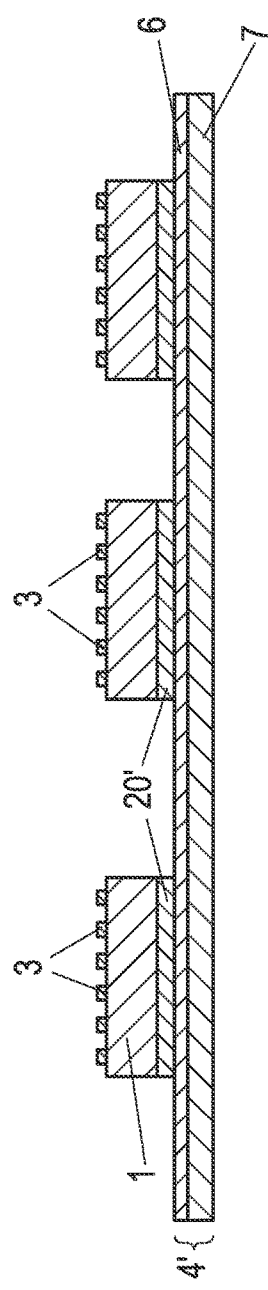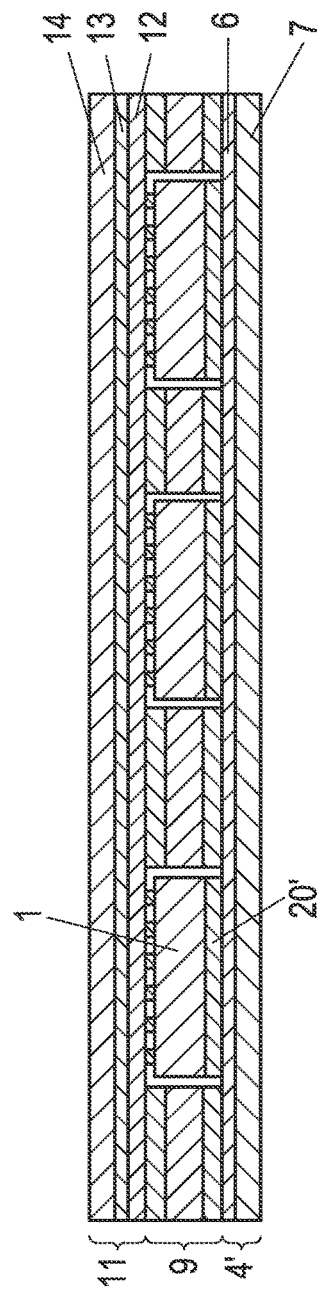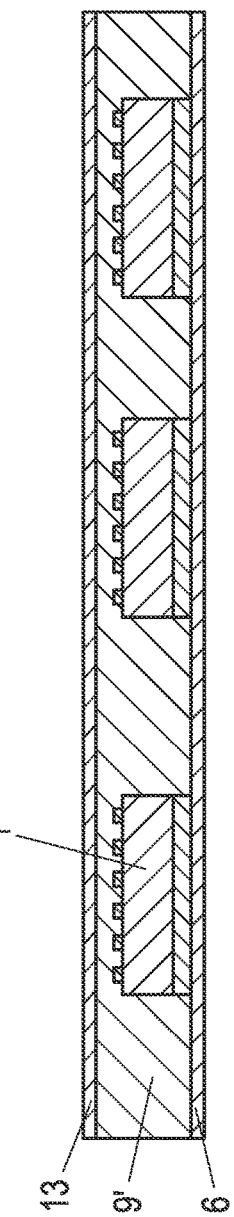

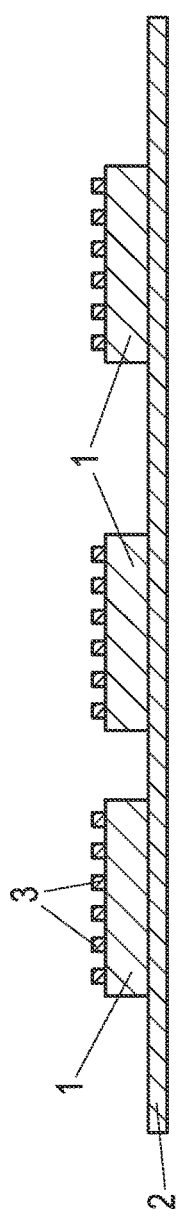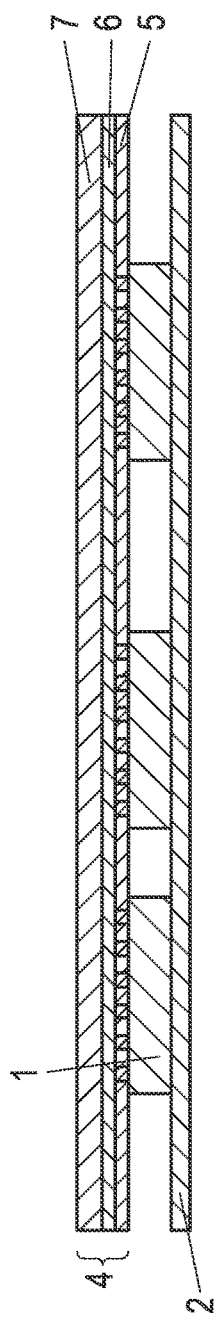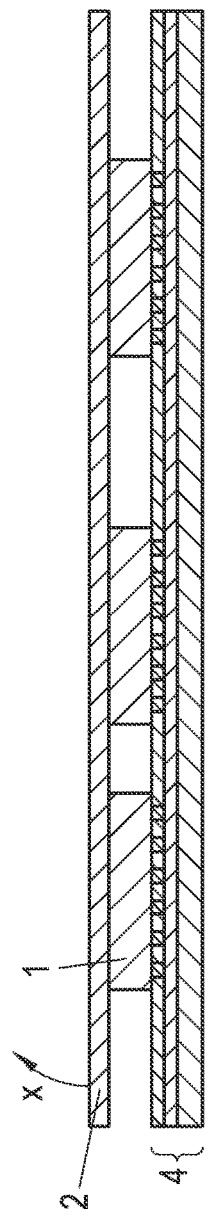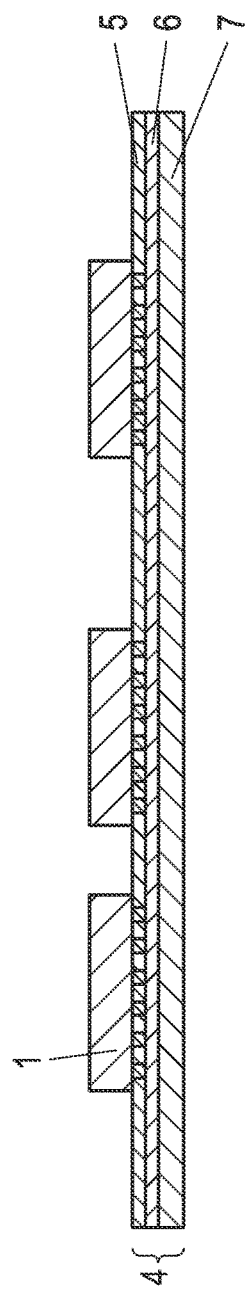

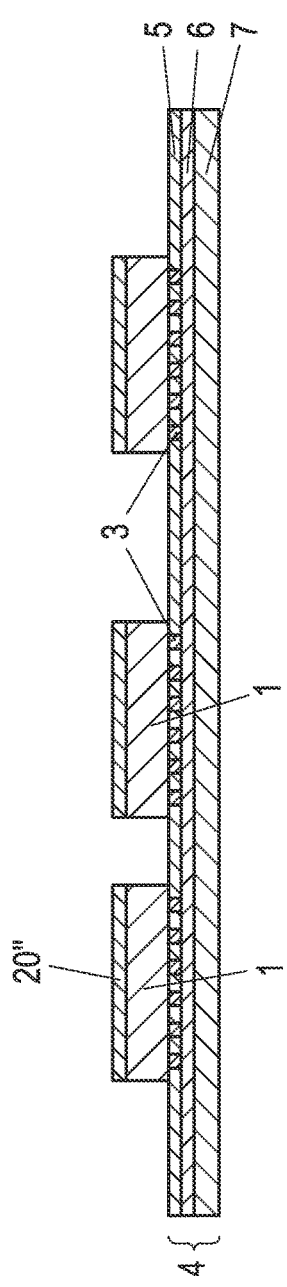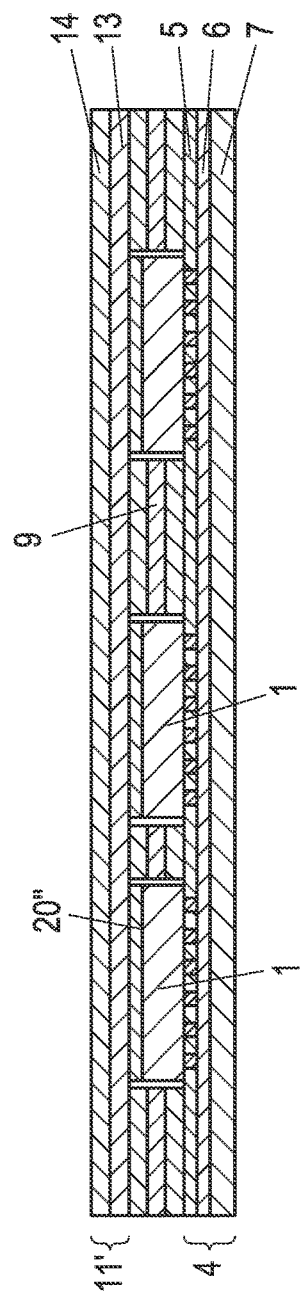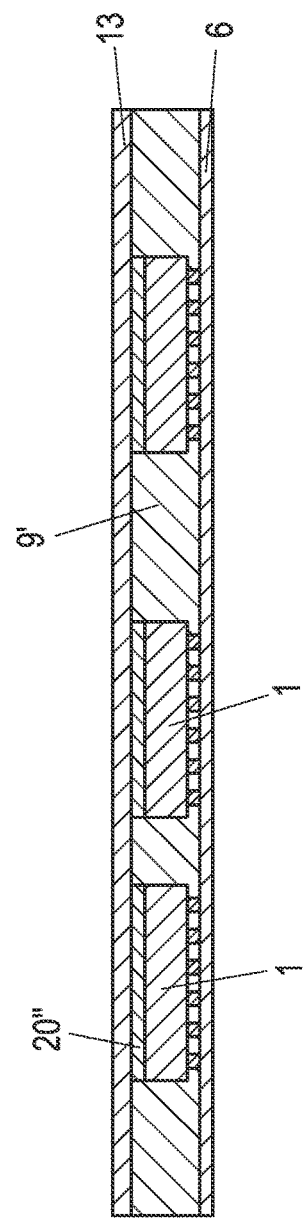

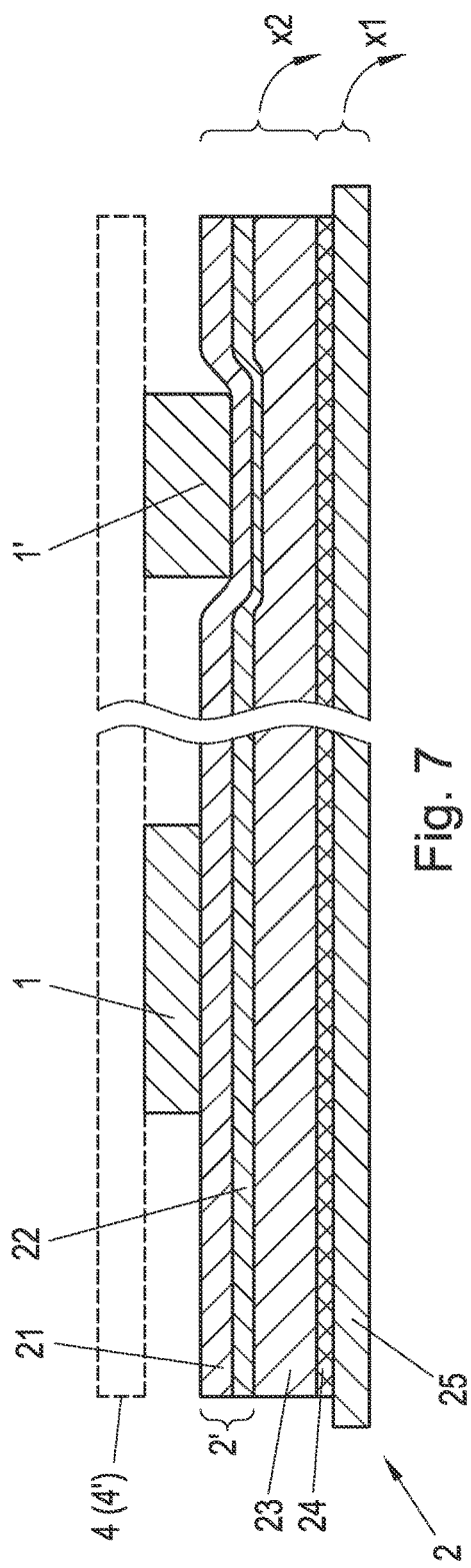
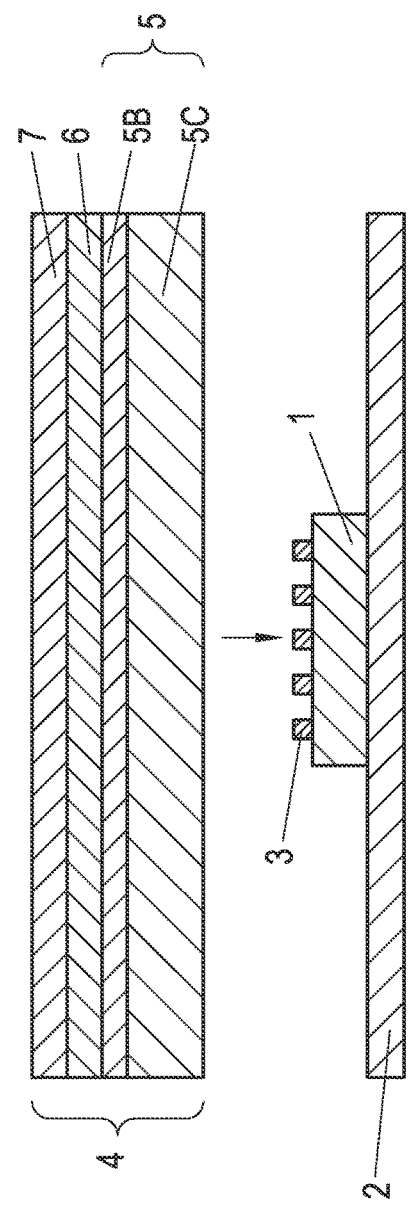
Fig. 7
Fig. 8

METHOD FOR PRODUCING A CIRCUIT BOARD ELEMENT

RELATED APPLICATION INFORMATION

This application is a 371 of International Application PCT/AT2014/050066 filed 17 Mar. 2014, and which claims priority from Austria Patent Application A 50222/2013 filed 2 Apr. 2013, the content of which is incorporated herein by reference.

The invention relates to a method for producing a printed circuit board element comprising at least one electronic component which has a connection side defined by electrical contacts or a conductive layer, wherein the component for positioning is connected to a temporary carrier and is embedded in an insulating material.

In connection with growing product functionalities of devices provided with electronic components and increasing miniaturisation of such electronic components and also an ever larger number of electronic components, with which printed circuit boards are to be equipped, higher performance units or packages built in an array-like manner and with a plurality of electronic components are increasingly being used in technology, which have a multiplicity of contacts or connectors, with an ever reduced spacing of these contacts. For this reason with—a simultaneous reduction of product size, the components to be used and the printed circuit boards equipping electronic components by means of the required multiplicity of contact points is becoming more and more difficult.

It has already been suggested to integrate electronic components into a printed circuit board at least to some extent, cf. for example WO 03/065778 A, WO 03/065779 A or WO 2004/077902 A. In these known technologies, it is disadvantageous however, that depressions or holes, i.e. cavities, are to be provided in a base element, the substrate of the printed circuit board, for accommodating the electronic components. Soldering processes and bonding technologies are used for contacting the components, wherein contact points between materials of different types (conductor tracks on the one hand and contact or connection points of the electronic components on the other hand) typically result. Principally, when using systems of this type in environments with large temperature differences or temperature change regions, stresses result due to different materials in the region of the contact or connection points, due to the different coefficients of thermal expansion, which stresses can lead to cracks in contact or connection points and thus to the failure of the unit. Furthermore, it is to be assumed that additionally necessary holes, particularly lasered holes, for producing contacts, load the components. Furthermore, it is disadvantageous that contacting of the components inserted into the cavities, which are to be produced, at conductor tracks and contact surfaces is made more difficult by solder pastes or bond wires or, in the case of use with fluctuating temperature loads in particular, cannot be achieved reliably. Also, high pressures and temperatures during the printed-circuit-board production process may load the embedded and contacted components. Furthermore, heat dissipation of electronic components that may be more severely loaded is problematic.

A technology for integrating an electronic component into a printed circuit board is described in WO 2010/048654 A1, in which the component is fixed with the aid of an adhesive on a substrate, which is later removed and on which a preferably electrically conductive layer had previously been applied. The component is then embedded in an insulating material, on which a conductive layer is in turn applied. In this construction, the insulating layer, for example a prepreg material, has a different coefficient of thermal expansion than the adhesive during heating, so that warping occurs in the printed circuit board element—particularly in the region of the component—in the following heating and curing steps. This warping may for example lie in the order of magnitude of approx. 150 μm. Moreover, problems also result when contacting the component with the aid of micro drill holes, so-called μvias.

Similar applies to for the technology described in DE 10 2009 029 201 A1 for producing a component comprising a micro- or nano-structured element. A multi-layered support is used here, which supports an electrically conductive layer via a connecting layer, such as in particular what is known as a so-called RCC (resin-copper-coated) film, namely with an epoxy layer and a copper layer, wherein the copper layer is connected via a connecting layer to the actual temporary support, which is later removed. The epoxy layer and the copper layer remain on the printed-circuit-board element. As long as the actual support is still present, the group of electronic components is applied to these layers, whereupon the same are encapsulated with an insulating material. Here also, distortions or warping of the printed circuit board element produced results during the heating and curing processes due to the different coefficients of thermal expansion.

It is now a object of the invention to at least ameliorate these problems at least as much as possible and to enable the production of printed circuit boards or printed circuit board elements, in which a reliable integration of electronic components is enabled, particularly even in the case of simplified contacting. In particular, construction during the production of the printed circuit boards should be enabled, which allows a symmetry with respect to the respectively used materials, so that discarding of the printed circuit board can be avoided during the heating or curing processes. Furthermore, making the printed circuit board structure bubble-free is also intended.

Accordingly, the invention provides a method for producing a printed circuit board element as specified at the beginning, which is characterised in that the component is applied directly on a plastic film as a temporary carrier in a predetermined position, whereupon, on the side of the component opposite the plastic film, a composite layer with at least one carrier and an electrical conductor, preferably also with an insulating material, with the carrier facing away from the component, is affixed and thereafter the plastic film is detached, and in that the component is then embedded in insulating material.

Advantageous embodiments and developments of this method are specified in the dependent claims.

In the case of the present method, it is not only possible to dispense with the use of a substrate of the printed circuit board, in which cavities for the components must be produced, but a greater reliability is also achieved with regards to the possible faultlessness of the printed circuit board, more specifically the material surrounding the electronic component, because air inclusions, which otherwise principally occur time and again when integrating larger components, can be prevented. This is achieved in that the respective heating or curing or laminating steps may take place under vacuum, as a result of which no air bubbles can survive; the prevention of such air inclusions is particularly advantageous in the contact areas. It is also important for the present method that the entire temporary carrier is removed again during the method and a symmetrical structure of the circuit-board structure is enabled, which contributes considerably to making it possible to prevent warping of the circuit boards that are produced in the curing steps as a consequence of various instances of polymerisation shrinkage in the case of different materials. Consequently, it is also particularly important for this symmetrical structure if after the embedding of the component in insulating material, a further composite layer, which has at least one electrical conductor and a support, preferably also an insulating material, is applied on the side opposite the first composite layer on the component and on the embedment thereof. Furthermore, with a procedure of this type, it is also advantageously made possible to build a multi-layer printed circuit board, in which circuit parts are thus realised in a plurality of planes.

"Embedding" should here be understood to mean a mere lateral encapsulation of the component(s) as well as such an encapsulation including covering.

A—conventional—adhesive film can be used as temporary carrier, wherein this adhesive film can expediently be made up of an adhesive layer, for example with acrylic or silicone, on a carrier layer, for example made from PET material, or a thin metal film, for example aluminum. Adhesive films of this type are commercially available and are also termed "sticky tape".

In the course of embedding the electronic component, a type of "substrate body" for the printed circuit board is obtained similarly to DE 10 2009 029 201 A1. During this step of embedding the electronic component in the insulating material, the electronic component can also be covered on the side facing away from the "connection side", which does not absolutely have to be the case however. Here, "connection side" is understood to mean the side of the component on which the electrical contacts of components are present or else at least the greater number of contacts is present, wherein a conductor layer or metallisation can nevertheless then also be present on the opposite side, the rear side, as will be explained in more detail in the following.

An advantageous approach for the embedding is characterised in that the component is embedded in a preconditioned prepreg material used as insulating material for embedment, which material has a recess for the component. Here, recourse is made to a common technology in printed circuit board production insofar as preconditioned prepreg materials are common quite generally for constructing substrates and insulating layers in printed circuit boards. In the present case, however, recesses are to be provided in the prepreg material for the electronic components, so-called cavities.

A beneficial approach is characterised in that the component is embedded in the insulating material of the composite layer, which has a layer thickness at least equal to the thickness of the component. Here, it is advantageous that a separate step, in which the insulating material is provided separately, is superfluous because the insulating material of the composite layer is used directly for embedding the electronic component.

It is furthermore advantageous at the present method that a thin insulating layer can be achieved on the connection side of the electronic components, wherein the comparatively low thickness of this insulating layer between the contacts of the components and the conductive surface present there in the finished printed circuit board element facilitates the electrical connection of the components to the structured conductive surface, as a result of which high connection densities can be achieved.

Thin insulating layers of this type in the region of the contacts of the components can also be advantageously achieved if a component with a dielectric layer applied on one side thereof is used, wherein this component is applied on the plastic film using the side opposite the dielectric layer. In this case, the electronic components are therefore affixed on the temporary carrier with the connection side uppermost, away from the temporary carrier, that is to say "face up". The composite layer is then applied on this side, particularly without insulating material, whereupon the temporary carrier on the opposite side of the component(s) is removed, in order to then enable the embedment of the component(s) in the insulating material and preferably the affixing of the further composite layer from this side.

When affixing a dielectric layer on a side of the electronic component, there is the option to affix this dielectric layer or insulating-material layer on the "connection side" or on the side of the component opposite the contacts and then to affix the composite layer on this side, without insulating material, rather only with carrier and conductor; then, as stated, the temporary carrier is detached from the connection side of the components and the encapsulation or embedding of the components is undertaken.

An advantageous embodiment of the present method is furthermore characterised in that a component with a dielectric layer applied on one side thereof is used, wherein this component is affixed on the plastic film using the side opposite the electrically conductive layer. In this approach, the components are therefore affixed "face down" on the temporary carrier. The electrically conductive layer on the side of the components opposite the contacts can on the one hand be used for contacting the components, for example as an earth electrode, and furthermore also for heat dissipation. Here also, a composite layer without insulating material, that is to say only with carrier and conductor, is incidentally affixed on the side of the components carrying the electrically conductive layers.

A particularly efficient approach furthermore results if, at the composite layer consisting of support and electrical conductor, an e.g. pasty, electrically conductive material is affixed, e.g. by printing, on the electrical conductor of the composite layer at the site of the component before the composite layer is connected to the component and the plastic film is subsequently detached. In this approach, a metallisation is enabled on the rear side of the electronic components in one and the same step when affixing the composite layer, with the local electrically conductive material parts, on the side opposite the temporary carrier for the components.

Furthermore, it is also advantageous if an e.g. pasty electrically conductive material is affixed, e.g. by pressing, on the side opposite the connection side of the component, after detaching the plastic film. In this approach, a simpler registration results for the various process steps, as registration for the conductive layer of the composite material may be superfluous.

As mentioned, in the present approach, the various heating and curing or laminating steps can take place in a vacuum, and in particular the composite layers can be affixed in a vacuum, in order to thus obtain the desired freedom from bubbles.

It is particularly advantageous then in the present method, if at least one registration element for use during subsequent method steps is applied on the plastic film at the same time as the component. By affixing (equipping) the registration elements simultaneously with the electronic components, it is not only possible to achieve a saving of a registration step on conventional registration marks, but also a particularly high accuracy for the subsequent process steps is also enabled.

To adjust electronic components, which may have different heights and are to be embedded, and/or to compensate product tolerances of such electronic components, it is suggested according to a further preferred embodiment that a compressible material is connected to the plastic film. By providing a material which can be compressed at least to some extent, for the temporary carrier, height differences when providing or processing a plurality of electronic components can be taken into account in a simple and reliable manner, without complex adaptation operations for example at the production plant or the use of different raw materials.

For reasons of dimensional stability, it has also been shown to be advantageous if the carrier of the composite layer and/or the further composite layer is formed from a dimensionally stable material, such as a metal, from copper, aluminum, or a dimensionally stable polymer, which has a UV transmittance in particular.

It is particularly advantageous for the laminating process, with regards to a particularly simple and reliable connection between the composite layer and the component and/or the layer encapsulating the component if the insulating material of the composite layer and/or the further composite layer is formed of a material, e.g. a duroplastic, which changes its viscosity during connection to the component. In this connection, it is in particular suggested that the material changing its viscosity is formed of a duroplastic, which is cured after the connection process, particularly lamination process.

During the production of a printed circuit board, in order to achieve a corresponding mechanical strength and/or dimensional stability during further processing or working steps and/or a further use under possibly harsh environmental conditions, it is furthermore provided that the insulating material of the composite layer and/or the further composite layer is formed from a non-deformable dielectric material, on which a further layer made from non-conductive material, which changes its viscosity during connection to the component, is affixed. A dimensionally stable material of this type lends a satisfactory dimensional stability and strength to the printed circuit board to be produced or the printed circuit board intermediate product.

Taking account of the increased temperatures arising in the course of the production of a printed circuit board, it is furthermore advantageously provided that a material with a melting point which is higher than 220° C., particularly higher than 250° C., is chosen as non-deformable dielectric material. Requirements of this type can be achieved in a simple and reliable manner for example in that a hardened duroplastic, for example epoxy, is chosen for the insulating material, as corresponds to a further preferred embodiment of the method according to the invention.

It is furthermore suggested in the sense of a minimisation of the thickness of the printed circuit board, to form the conductive layer of the composite layer(s) from a metal, preferably copper, with a thickness of less than 20 µm, particularly a thickness between 10 nm and 10 µm; sputtering is preferably used to produce such thin metal layers, particularly in the region of 10 nm or several tenths of nm.

In the sense of a dimensionally stable construction of the temporary carrier for handling in the first method steps, it is also furthermore advantageously provided that a dimensionally stable layer, preferably a metal sheet, is connected to the plastic film, which dimensionally stable layer is releasably affixed in the case of a compressible material to the side thereof facing away from the component.

After the embedment of the electronic component and the connection at least to the composite layer in the region of the contacts or the conductive surface of the electronic component, it is preferably provided for contacting the embedded component that, after the connection, particularly lamination of the electronic component to the composite layer and also possibly to at least one further composite layer, a structuring of at least the one conductive layer of the composite and/or a contacting with the contacts or the conductive layer of the embedded electronic component is or are carried out on the other side. Such a contacting is carried out with method steps that are known per se, wherein instead of a subsequent structuring, e.g. constructions of composite layers can also be used, in which for example the conductive layer is already structured in advance for example in accordance with the electronic component to be contacted therewith.

As already mentioned, it can be provided that a plurality of electronic components having possibly different dimensions, particularly different heights, are provided.

The invention is explained in more detail hereinafter on the basis of exemplary embodiments that are illustrated schematically in the attached drawing. In the figures:

FIGS. 1a to 1g show successive method steps of a method according to the invention for integrating at least one electronic component in a printed circuit board or a printed circuit board intermediate product;

FIGS. 2a to 2d show successive method steps in the production of a printed circuit board element according to a different embodiment of the present invention;

FIGS. 3a to 3c show the steps of a further modified production method;

FIGS. 4a to 4g show the steps of a method for producing a printed circuit board or a printed circuit board element according to yet another embodiment of the present invention;

FIGS. 5a to 5g show method steps according to yet another production method;

FIGS. 6a to 6g show successive method steps according to a further modified production method according to the invention;

FIG. 7 shows a schematic partial cross section through a temporary carrier 2, which is modified compared to the embodiments according to FIGS. 1 to 6, wherein two components of different thickness are shown on this temporary carrier quite schematically and on an exaggerated scale; and FIG. 8 schematically shows an exemplary embodiment in a partial cross section, with a composite layer which has part layers as insulating material, a dimensionally stable layer and a curable layer.

It can be seen in FIG. 1a that a plurality of electronic components 1 is arranged on a temporary carrier 2 in the form of a plastic film 2, particularly adhesive film 2 (cf. FIG. 7), for the temporary support of the components 1, wherein contacts 3 of the electronic components 1 face away from the plastic film 2 (so-called "face up" position). Instead of the illustrated contacts 3, a conductive, particularly structured surface of the electronic components 1 to be embedded or to be integrated can also be provided on the side facing away from the plastic film 2. This side of the components 1 is termed the connection side in the following, wherein the opposite side can fundamentally also have one or a plurality of contacts or conductor surfaces, for example as an earth connection. For example, IGBT components have a source and a gate connection on one side, and a drain connection on the opposite side.

In the following, a composite layer 4 is arranged on the electronic components 1 on the side of the contacts 3 according to the method step illustrated in FIG. 1b, wherein in the embodiment illustrated in FIG. 1b, the composite layer 4 consists of a layer 5 made up of a non-conductive material (termed insulating material 5 or dielectric layer 5 for brevity in the following), a layer 6 made up of a conductive material (termed conductor 6 for brevity in the following) and a support layer 7 (termed support 7 for brevity in the following).

The composite layer 4 can simultaneously cover the component(s) 1 to be embedded or to be integrated with an insulating material 5.

In the following, a connection between the composite layer 4 and the electronic components 1 takes place according to the method step illustrated in FIG. 1c. This connection can for example be undertaken by means of lamination, wherein to this end, as shown schematically, a heated pressing device or a press stamp 8 can be used, cf. also the arrows P illustrating the exertion of pressure in FIG. 1c.

After the connection of the electronic components 1 to the composite 4, particularly with the embedment of the contacts 3 in the insulating material 5, the plastic film 2 is removed and the unit contained is turned through 180°, as indicated in FIG. 1d, in order to continue the production of a printed circuit board or a printed-circuit-board element or intermediate product.

Accordingly, it can be seen in the method step illustrated in FIG. 1e that to embed the electronic components 1, encapsulation of the same is undertaken by means of an insulating layer 9, e.g. by providing further layers or plies 9, which are formed of a prepreg for example, which is provided with corresponding recesses or depressions (cavities) 10 matching the arrangement and the dimensions of the electrical components 1.

However, it would also be conceivable here to cast the components 1 in a still-liquid resin, which is subsequently cured.

Furthermore, the encapsulation of the components 1 could also take place as soon as during the step according to FIG. 1c, if the insulating or dielectric layer 5 of the composite layer 4 has a satisfactory thickness, namely a thickness at least equal to the thickness of the components 1, as is illustrated schematically in FIG. 1c at 5A; in this case, each component 1 is embedded directly in insulating material or dielectric 5 (or 5A) of the composite layer 4, i.e. a separate insulating material, such as for example the prepreg material 9 according to FIG. 1e, is then not necessary.

For the further construction of the printed circuit board to be produced, it can be seen in FIG. 1f that to produce an essentially symmetrical arrangement, after applying the insulating material 9 or prepreg 9, a further composite layer 11 can be arranged on the side of the components 1 facing away from the contacts 3, similarly to the composite layer 4. Matching the structure of the composite layer 4 to a large extent, this further composite layer 11 also comprises a layer 12 made up of a non-conductive material, that is to say an insulating layer 12, a layer 13 made up of a conductive material, that is to say a conductor 13, and also a support layer 14 or a(detachable) carrier 14 for brevity.

This further composite layer 11 is preferably constructed as identically as possible ("mirror identically") to the composite layer 4, in order to thus achieve a symmetry in the structure shown in FIG. 1f. A symmetrical structure of this type is greatly advantageous during the subsequent final lamination and curing, as shown in FIG. 1g, in order to prevent any bending or "dishing" or distortion of the printed circuit board element during the lamination process for curing all layers, as a consequence of different polymerisation shrinkage. In this context, it is also advantageous that during the present approach, the temporary carrier 2 is removed completely, so that ultimately on both sides of the components 1, a symmetrical structure with the insulating material 5 or 12 and the conductors 6 or 13 is obtained for example.

The individual layers or plies are illustrated in FIG. 1f in a mutually connected, particularly laminated state, so that overall a corresponding embedment of the components 1 has already been undertaken.

For a further processing or working of the printed circuit board to be produced, it is indicated in FIG. 1g that after the removal of the respective carrier 7 or 14, the conductive layers 6 and 13 of the composite layers are structured, wherein contacting 15 with the contacts 3 of the components 1 and also additional through holes 16 in the conductive layers 6 or 13 are furthermore indicated. Structuring and contacting of this type is known per se, so it is not necessary to explain it in more detail.

Approaches of this type are of course also to additionally be considered in the method examples explained in the following.

Using the method described above (and in the following), an embedment of electronic components 1 in "printed circuit boards" is possible independently of the size of the components 1, and it is furthermore particularly advantageous that no adhesive, which constitutes a foreign substance and can lead to air bubbles, is introduced into the printed circuit board. The fixing of the components 1 with the composite layer 4 or 11 can take place in a vacuum, wherein no solvent is required and air bubbles are prevented. Furthermore, a small spacing can be obtained between the contacts 3 of the components 1 and the conductive layer 6 to be connected to the same (after the structuring), which is advantageous for the contacting during the placing of lasered holes. Moreover, the connection of the components 1 to the composite layer 4 (and also 11) takes place in a single step. Overall, comparatively particularly thin printed circuit board structures can be obtained with the described method.

These measures and advantages also apply for the exemplary embodiments according to FIGS. 2 to 8 described in the following.

In the part figures FIGS. 2a to 2d of FIG. 2, and also in the following figures, elements that correspond to elements in FIG. 1 are labelled with corresponding reference numbers, provided with an apostrophe if appropriate, if a modification exists.

In the method illustrated in FIG. 2, the aim is in turn to fix electronic components 1 in a fixed position relatively to a conductive layer 6, wherein air inclusions are likewise to be prevented where a dielectric material is affixed.

In the method according to FIG. 2 also, electronic components 1 are applied "face up", that is to say with the connection side upwards as according to FIG. 1, on a plastic film 2, particularly adhesive film, serving as temporary carrier 2, cf. FIG. 2a in which the components 1 are shown still at a distance above this adhesive film 2, and also the subsequent method step according to FIG. 2b. By contrast with the method according to FIG. 1, it is therefore not a three-layer composite layer 4, but rather a two-layer composite layer 4 which is affixed on the connection side of the components 1. This is therefore provided as such, because previously, cf. FIG. 2a, an insulating layer or dielectric layer 5' was affixed on the components 1 over the contacts 3, wherein one is concerned here for example with a bubble-free B stage dielectric (that is to say a partially cured duroplastic insulating material).

According to FIG. 2c—after the fixing of the components 1 on the adhesive film 2 according to FIG. 2b—the affixing of the previously mentioned two-layer composite layer 4' takes place using a conductor layer 6 and a support layer 7.

The local dielectric layers 5' on the components 1 can be particularly thin, so that a particularly small spacing between the components 1 and the conductor layer 6 of the composite layer 4' can be achieved, which is advantageous, as mentioned, during later contacting of the connections 3 when drilling lasered holes or vias.

Laminating the composite layer 4' onto the components 1, more specifically onto the thin dielectric layers 5' thereof, can also inherently take place using a downward-facing connection side of the components 1, that is to say "face down", i.e. when affixing the components 1 on the plastic film 2 with the dielectric layers 5'.

Furthermore, in the method according to FIG. 2, it is possible to proceed as previously on the basis of FIGS. 1d to 1g, i.e. after turning the arrangement, cf. FIG. 2d, and detachment of the temporary carrier 2, cf. arrow x in FIG. 2d, the components 1 are embedded in an insulating layer, e.g. prepregs 9; a further composite layer 11—possibly also likewise without insulating material 5—can be affixed, wherein the supports 7 and 14 are then detached. The lamination or curing preferably takes place in turn under vacuum, wherein an increased temperature is applied, in order to finally cure the dielectric 5'. In this manner, a bubble-free connection between the components 1, the dielectric layers 5 and the conductor layer 6 or 13 is achieved. Subsequently, the conductor layers 6 or 13 are structured in turn and the contacts for the connections of the components 1 are produced.

In the method illustrated in FIG. 3, electronic components 1 likewise coated with a dielectric 5' are used, but this time, by contrast with FIG. 2, this dielectric 5' is in each case located on the side opposite the connection side, i.e. the side provided with the contacts 3, of the components 1. The components 1 are then fixed "face down", i.e. with the contacts 3 thereof facing the plastic film or adhesive film 2 which is in turn used as temporary carrier 2, on the plastic film or adhesive film, cf. FIGS. 3a and 3b. Subsequently, according to the step as illustrated in FIG. 3c, a two-layer composite layer 4', namely without the insulating layer 5 according to FIG. 1, is applied and laminated on the sides of the components 1, which face away from the adhesive film 2. Then, in turn the structure obtained can—but this is not illustrated further in FIG. 3—be turned through 180°; the adhesive film 2 is removed, and an additional composite layer 11—here with insulating layer 12—can be applied after the components 1 have been embedded in insulating material, such as prepregs 9 according to FIG. 1.

A further variant of the present method for producing printed circuit boards or printed circuit board elements is illustrated in the Part FIGS. 4a to 4g of FIG. 4, wherein components 1 are used which are coated on the side thereof opposite the contacts 3 with an electrically conductive material 20, which can likewise be applied in a 'bubble-free manner and forms a partially cured ("B stage") layer or a pre-dried layer (metal granulate). These components 1 are here in turn applied "face down" onto an adhesive film 2, generally plastic film 2, provided as temporary carrier 2, cf. FIG. 4b compared to FIG. 4a. Subsequently, similarly to in the exemplary embodiment according to FIG. 3, a two-layer composite layer 4' with a conductor 6 and a carrier 7 is applied on the opposite side of the components 1, on the electrically conductive material layers 20 of the components 1, cf. FIG. 4c. This arrangement is then turned through 180°, cf. FIG. 4d, and the adhesive film 2 functioning as temporary carrier 2 is detached from the components 1 or the contacts 3 thereof, cf. arrow x in FIG. 4d. Subsequently, in a manner similar to that already illustrated in FIGS. 1f and 1g and described on the basis of these figures, an encapsulation or embedment of the components 1 in insulating material, e.g. in prepregs 9 with recesses or cavities provided therein, is undertaken and an additional composite layer 11 with insulating material 12, a conductor 13 and a support 14 is affixed thereon, cf. FIG. 4f. Subsequently, the carriers 7 and 14 are detached and the insulating material 9 is cured fully, so that the state according to FIG. 4g with a cured insulating-material body 9 is obtained. Subsequently, the described conductor structuring and contacting, which is not illustrated in any more detail here, then takes place.

In the method according to FIG. 4 also, the lamination can take place under a vacuum at an elevated temperature, wherein a bubble-free connection between the components 1, the electrical conductor materials 6 and 12 and the conductor layers 20 is achieved.

The electrically conductive material 20 on the components 1 can be obtained from a strip material, which contains a binding agent in the form of a resin which is partially cured (thus is in a B stage) and metal powder, e.g. silver. This material is bubble-free and is affixed on the "rear side" of the components 1. The material of these layers 20 is non-adhesive at room temperature, and an elevated temperature is required if it is connected to the metal layer, i.e. the conductors 6. The conductive material 20 can be used in the finished printed circuit board for heat dissipation and/or as a contact, e.g. for the drain electrode of an IGBT transistor.

The method variant according to FIG. 5 is modified compared to that according to FIG. 4 to the extent that this time, after applying the components 1 using the side where the contacts 3 are present (therefore "face down") on the temporary carrier adhesive film 2 (FIG. 5a), the components 1 are connected to a composite layer 4' containing a support 7 and a conductor 6, wherein this composite layer 4' is moreover provided with electrically conductive material 20' or corresponding part layers 20' made up of this material in positions corresponding to the positions of the electronic components 1 (on the adhesive film 2). These layers 20' made up of electrically conductive material correspond in terms of the construction thereof or structure thereof and also the function thereof to the layers 20, as explained on the basis of FIG. 4, wherein there, the layers 20 are pre-affixed on the components 1 instead of on the composite layer 4'. After laminating the composite layer 4' with the electrically conductive part layers 20' onto the components 1, cf. FIG. 5c, the structure obtained is again turned through 180°, cf. FIG. 5d, and the temporary carrier 2 in the form of the adhesive film 2 is removed, cf. arrow x in FIG. 5d. The subsequent steps according to FIGS. 5e, 5f and 5g correspond to the steps 4e, 4f and 4g, as explained previously, so that a repeated description may be superfluous.

The electrically conductive material of the layers or part layers 20 or 20' can for example also consist of a paste, which contains a metal powder, such as silver, and a binding agent. This paste can be thermally sintered. It can be applied on the conductor layer 6 (or on the components 1) in advance by means of printing on, for example by screen printing, stencil printing and similar application technologies. The paste is dried at an elevated temperature, in order to remove binding agent and solvent. After the drying of this material, a porous structure is obtained. Connecting in a vacuum in turn prevents the inclusion of air bubbles at the connection areas between the components 1 and the electrically conductive layers 20 or 20'. During the lamination process, the porous structure is condensed by applying pressure and temperature, so that in each case solid metal layers are formed in this low-temperature sintering process.

In the method variant according to FIG. 6, the method steps illustrated in the FIGS. 6a to 6d practically correspond to the method steps according to FIGS. 1a to 1d, wherein however, the press stamp 8 (cf. FIG. 1c) has been left out in the part figures of FIG. 6. In this respect, a repeated explanation may be superfluous.

After the step according to FIG. 6d, according to FIG. 6e, a layer 20" made up of an electrically conductive metal paste is applied on the components 1, specifically on the side of the components 1 opposite the connection side. The electrically conductive paste for the layers 20" is dried as described before in connection with FIG. 5.

A lamination of an additional two-layer composite layer 11' with a conductor 13 and a support 14 then takes place, cf. FIG. 6f, i.e. without an insulating layer 12, after the components 1 including layer 20" had previously been embedded in a prepreg insulation 9 as described. Finally, after the detachment of the supports (carriers) 7 and 14, the composite according to FIG. 6g with the conductor plate body 9' is obtained.

The advantage of this approach is a reduced outlay during the registration of process steps. In the method according to FIG. 5, it is necessary to align the temporary support 2 having the components 1 fixed thereon with the conductive pastes 20' on the composite layer 4'; by contrast, in the example of FIG. 6, the metallic conductive paste is present on the components 1 and a registration for the conductor position 6 is superfluous.

The pastes or layers 20' or 20" sometimes shrink during heating and lamination of the composite layer 11' by 50% in terms of thickness.

For positioning or registering the components 1 to be embedded, registration elements or markings can generally be provided on the temporary support 2. It is particularly advantageous furthermore, if for the following process steps, registration elements 17 are provided, as are shown schematically in FIGS. 1a to 1e. These registration elements 17 remain in the unit even after the removal of the adhesive film 2.

Aside from these registration elements 17, components 1 already present on the plastic film 2 can also be used as registration elements.

For temporarily fixing the components 1, the support plastic film 2 is, as mentioned, preferably constructed as an adhesive tape or film, particularly with a pressure-sensitive adhesive, which enables a reliable positioning and provisional fixing of the components 1 and also a subsequent simple removal of the temporary support 2 after the method step illustrated e.g. in FIG. 1c. On the other hand, with regards to a reliable positioning of the components 1, a support material, which is as dimensionally stable as possible, is advantageous for the temporary support 2.

To compensate different heights of the components 1 to be accommodated and if appropriate production tolerances in the dimensions of the components 1 to be accommodated, it may also be expedient to equip the temporary support 2 with a compressible material, which allows the thicker components 1 to be pressed in. With a compensation of this type between differently sized components 1, an exact connection of the components 1 to the common composite layer 4 is enabled in the subsequent production steps e.g. according to FIGS. 1b and 1c.

Such a construction of a temporary support or carrier 2, as indicated previously, can be drawn from the illustration in FIG. 7. The temporary support 2 shown here is a multi-layered structure, with a plastic film in the form of an adhesive film 2', which contains an adhesive layer 21 and also a support layer 22, e.g. made from a PET material, carrying this adhesive layer 21. An acrylic or silicone material can be used as adhesive for example. Affixed below this adhesive film 2' according to FIG. 7 is a compressible layer 23, for example made from a Teflon material, which allows a certain pressing in of a component 1' having a somewhat larger thickness due to the structure thereof or owing to tolerance differences. In this manner, it is more easily possible in the later step of applying the composite layer 4 or 4', as indicated in FIG. 7 with dashed lines, to apply this composite layer 4 or 4 on an essentially uniform level above the component 1, 1'.

With regards to the previously mentioned good dimensional stability, it is therefore furthermore possible in the case of such a temporary composite support 2, as shown in FIG. 7, to affix a dimensionally stable layer or ply 25, for example a metal sheet, with the interposition of a connection layer 24 on the underside or external side of the compressible layer 23. The connection layer 24 is preferably formed of an adhesive, which is known per se and can be dissolved thermally or else by UV radiation, wherein it is then possible to detach the dimensionally stabilising layer 25, for example by heating, together with the adhesive or connection layer 24, from the remainder of the temporary support 2, whereupon the remaining temporary support 2, i.e. the adhesive layer 2' and the compressible material layer 23 can be detached from the components 1 (1'), namely after the composite layer 4 (or 4') had been affixed previously, as described, on the opposite side of the components 1, 1'. If using UV-dissolvable adhesives, a UV-permeable material is used for the support 25, in order to enable the dissolution after the laminating process.

With regards to a corresponding mechanical strength during further processing or working steps, the support 7 of the composite layer 4 can also preferably consist of a correspondingly dimensionally stable material, for example of a metal, such as for example copper, aluminium, etc., or of a dimensionally stable polymer. Furthermore, it is conceivable to incorporate a dimensionally stable layer in the region of the insulating-material layer 5 of the composite layer 4 (and correspondingly in the composite layer 11). This is shown in FIG. 8 in a schematic section, wherein above an insulating-material layer 5C, which can for example also be used for embedding the components 1 on the temporary support 2 and has a corresponding thickness, a layer 5B made up of a non-deformable dielectric material is provided. This non-deformable dielectric material 5B is for example a material with a melting point which is higher than 220° C., in particular is higher than 250° C. As a result, this dimensionally stable layer 5B is not impaired during the curing of the actual insulating layer 5C.

To achieve a smaller thickness of the printed circuit board to be produced, a comparatively small thickness is chosen for the conductor layer 6 or the additional conductor layer 13, which thickness is chosen to be less than 20 µm, in particular between 10 nm and 10 µm. The application can take place e.g. by means of sputtering.

For maintaining a corresponding contacting of the components 1 or a connection between the components 1, particularly the surfaces having the contacts 3, and the insulating layer 5 or 12 of the composite layer 4 or 11, this insulating layer 5 or 12 can also be formed of a correspondingly temperature-resistant material, for example a hardened duroplastic, such as epoxy. If using such materials for the layer 5 or 12, a desired and correspondingly smaller spacing between the contacts 3 and the conductor layer 6 or 13 can also be reliably maintained, so that in turn the height of the printed circuit board can be correspondingly minimised.

It is additionally noted that the dimensional ratios or relative dimensions of the individual elements illustrated in the drawing are not true to scale.

A multi-layer printed circuit board is also enabled with the present method. By multiple repetition of the method steps illustrated and described in the drawing, a multi-layer printed circuit board can be obtained, wherein electronic components 1 can be integrated at different levels or planes in a simple and reliable manner.

The invention claimed is:

1. A method for producing a printed circuit board element comprising the steps of:
    (a) providing a plurality of electronic components with each having a connection side comprising a plurality of electrical contacts or a conductive layer;
    (b) affixing the plurality of electronic components directly on a plastic film as a temporary carrier with each of the plurality of electronic components being spaced apart from each other;
    (c) affixing a first composite layer comprising at least a carrier and an electrically conductive layer on a side of the plurality of electronic components that is opposite to the plastic film with the electrically conductive layer disposed between the carrier and the plurality of electronic components and with the electrically conductive layer extending over a space between the plurality of spaced apart electronic components;
    (d) detaching the plastic film from the plurality of electronic components; and
    (e) introducing insulating material into spaces between the plurality of electronic components.

2. The method according to claim 1, further comprising applying a second composite layer comprising at least an electrically conductive layer and a support on a side of the plurality of electronic components opposite the first composite layer.

3. The method according to claim 2, wherein the carrier of the first composite layer or the support of the second composite layer is formed from a dimensionally stable material or a dimensionally stable polymer.

4. The method according to claim 1, wherein the plastic film is an adhesive film.

5. The method according to claim 1, wherein the insulating material comprises preconditioned prepreg material having a plurality of recesses which can accommodate the plurality of electronic components.

6. The method according to claim 1, wherein the first composite layer has a thickness at least equal to a thickness of the plurality of electronic components and the insulating layer is introduced into the spaces between the plurality of electronic components before step (d).

7. The method according to claim 1, wherein each of the plurality of electronic components provided in step (a) comprises a dielectric layer and the plastic film is affixed in step (b) to a side of the plurality of electronic components that is opposite to the dielectric layer.

8. The method according to claim 1, wherein each of the plurality of electronic components provided in step (a) comprises an electrically conductive layer and the plastic film is applied to a side of the plurality of electronic components that is opposite to the electrically conductive layer.

9. The method according to claim 1, wherein the method comprises forming the composite layer by printing the electrically conductive layer on the carrier before affixing the composite layer on the plurality of electronic components in step (b).

10. The method according to claim 1, comprising affixing a pasty electrically conductive material on a side opposite the connection side of the plurality of electronic components after detaching the plastic film in step (d).

11. The method according to claim 1, wherein the first composite layer is affixed to the plurality of electronic components in a vacuum.

12. The method according to claim 1 comprising affixing at least one registration element on the plastic film to serve as a marker at the same time as the plurality of electronic components are affixed to the plastic film in step (b).

13. The method according to claim 1, wherein the plastic film comprises a compressible material.

14. The method according to claim 13, wherein a dimensionally stable layer is connected to the plastic film, wherein the dimensionally stable layer is releasably affixed to the compressible material on a side of the compressible material facing away from the plurality of electronic components.

15. The method according to claim 1, wherein the first composite layer comprises an insulating material layer between the electrically conductive layer and the plurality of electronic components, wherein the insulating material layer is formed of a material that is capable of changing its viscosity when the first composite layer is heated and pressed into connection with the plurality of electronic components.

16. The method according to claim 1, wherein the first composite layer comprises an insulating material layer between the electrically conductive layer and the plurality of electronic components, wherein the insulating material layer is formed from a non-deformable dielectric material and the first composite layer comprises a further layer made from non-conductive material that is capable of changing its viscosity when the first composite layer is heated and pressed into connection with the plurality of electronic components.

17. The method according to claim 16, wherein the non-deformable dielectric material has a melting point which is higher than 220° C.

18. The method according to claim 17, wherein the non-deformable material is a hardened duroplastic.

19. The method according to claim 1 further comprising structuring the plurality of electronic conductors after step (c).

20. The method according to claim 1, further comprising forming contact connections to the plurality of electronic components after step (c).

21. A method for producing a printed circuit board element comprising the steps of:
    (a) providing a plurality of electronic components with each having a connection side comprising a plurality of electrical contacts or a conductive layer;
    (b) affixing the plurality of electronic components directly on a plastic film as a temporary carrier with each of the plurality of electronic components being spaced apart from each other;

(c) affixing a first composite layer comprising at least a carrier and an electrically conductive layer on a side of the plurality of electronic components that is opposite to the plastic film with the electrically conductive layer disposed between the carrier and the plurality of electronic components; and
(d) detaching the plastic film from the plurality of electronic components; and
(e) introducing insulating material into spaces between the plurality of electronic components.

* * * * *